United States Patent
Yoon et al.

(10) Patent No.: US 12,160,983 B2
(45) Date of Patent: Dec. 3, 2024

(54) ELECTRONIC DEVICE INCLUDING SUPPORT PLATE

(71) Applicant: Samsung Electronics Co., Ltd., Gyeonggi-do (KR)

(72) Inventors: Hyunjoong Yoon, Gyeonggi-do (KR); Yongwon Cho, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 138 days.

(21) Appl. No.: 17/835,111

(22) Filed: Jun. 8, 2022

(65) Prior Publication Data

US 2023/0082434 A1 Mar. 16, 2023

Related U.S. Application Data

(63) Continuation of application No. PCT/KR2022/007319, filed on May 24, 2022.

(30) Foreign Application Priority Data

Sep. 14, 2021 (KR) .......................... 10-2021-0122238

(51) Int. Cl.
*H05K 7/20* (2006.01)
*H05K 1/02* (2006.01)

(52) U.S. Cl.
CPC ....... *H05K 7/20963* (2013.01); *H05K 1/0207* (2013.01)

(58) Field of Classification Search
CPC .......................... H05K 7/20963; H05K 1/0207
See application file for complete search history.

(56) References Cited

U.S. PATENT DOCUMENTS

| 5,570,271 | A | 10/1996 | Lavochkin |
| 2002/0080584 | A1 | 6/2002 | Prasher et al. |
| 2011/0303437 | A1 | 12/2011 | Lim et al. |
| 2012/0160452 | A1* | 6/2012 | Kang ................... H01L 23/427 165/104.13 |

(Continued)

FOREIGN PATENT DOCUMENTS

| JP | 10-335860 A | 12/1998 |
| JP | 2012-104520 A | 5/2012 |

(Continued)

OTHER PUBLICATIONS

International Search report dated Aug. 29, 2022.

*Primary Examiner* — Karabi Guharay
(74) *Attorney, Agent, or Firm* — Cha & Reiter, LLC

(57) ABSTRACT

An electronic device and a support plate are disclosed. The electronic device includes a first housing, a display disposed within the first housing, a printed circuit board disposed within the first housing, a heat dissipation plate disposed to face the printed circuit board, at least one heat pipe disposed between the heat dissipation plate and the printed circuit board, the support plate disposed between the printed circuit board and the heat dissipation plate. The support plate includes a first portion disposed so as to contact with at least a part of the at least one heat pipe, and a second portion extending from the first portion in a second direction perpendicular to a first direction in which the at least one heat pipe is disposed, the second portion coupled to at least a part of the heat dissipation plate.

20 Claims, 14 Drawing Sheets

(56) References Cited

U.S. PATENT DOCUMENTS

| | | |
|---|---|---|
| 2014/0233174 A1 | 8/2014 | Demange |
| 2016/0360645 A1 | 12/2016 | Achard et al. |
| 2018/0035528 A1 | 2/2018 | Kim et al. |
| 2019/0014696 A1* | 1/2019 | Choi .................... H05K 9/0081 |
| 2019/0380231 A1 | 12/2019 | Nakata et al. |
| 2020/0100389 A1 | 3/2020 | Park et al. |
| 2020/0367383 A1 | 11/2020 | Moon et al. |
| 2021/0041926 A1 | 2/2021 | Park et al. |
| 2021/0410268 A1 | 12/2021 | Moon et al. |

FOREIGN PATENT DOCUMENTS

| | | |
|---|---|---|
| JP | 2013-149952 A | 8/2013 |
| JP | 2014-159946 A | 9/2014 |
| JP | 2017-037979 A | 2/2017 |
| KR | 10-2010-0137955 A | 12/2010 |
| KR | 10-2011-0082354 A | 7/2011 |
| KR | 10-1095100 B1 | 12/2011 |
| KR | 10-2018-0014603 A | 2/2018 |
| KR | 10-2019-0060074 A | 6/2019 |
| KR | 10-2019-0070976 A | 6/2019 |
| KR | 10-2019-0098606 A | 8/2019 |
| KR | 10-2020-0054826 A | 5/2020 |

* cited by examiner

ELECTRONIC DEVICE INCLUDING SUPPORT PLATE

CROSS-REFERENCE TO RELATED APPLICATION(S)

This application is a continuation of International Application No. PCT/KR2022/007319, which was filed on May 24, 2022, and claims priority to Korean Patent Application No. 10-2021-0122238, filed on Sep. 14, 2021, in the Korean Intellectual Property Office, the disclosures of which are incorporated by reference herein their entireties.

BACKGROUND

Technical Field

Certain embodiments of the disclosure relate to an electronic device including a support plate.

Description of Related Art

Owing to development of information and communication technology and semiconductor technology, the world has seen rapid increase in the distribution and usage of various types of electronic devices. Particularly, recent electronic devices provide a diversity of communication functions and are highly portable.

An electronic device refers to a device that executes one or more functions according to installed programs, such as an electronic notebook, a portable multimedia player, a mobile communication terminal, a tablet PC, a video/audio player, a desktop/laptop computer, a vehicle navigation device, and a home appliance. For example, such electronic devices may output stored media information visually or audibly. As electronic devices increase in functional integration, and as ultra-high-speed and large-capacity wireless communication becomes increasingly common, a single electronic device, such as a mobile communication terminal, may now implement a diversity of functions previously performed by multiple devices. For example, a single electronic device, such as a portable terminal, may include a communication function, an entertainment function (e.g., videogames), a multimedia function such as music/video playback, communication and security functions, such as mobile banking and schedule management, and an electronic wallet for executing electronic payments. All these functions are often integrated into one electronic device. Such electronic devices are also miniaturized so that users may conveniently carry them.

Electronic devices equipped with a communication function, such as portable terminals, may be reduced in size and weight to maximize portability and convenience, and have multiple components disposed in a small housing space, which nevertheless may operate at high performance levels. In such devices, heat is generated from operation of the main components, such as an application processor (AP)/communication processor (CP), to achieve the desired levels of product performance. A heat dissipation structure is often included to reduce interior temperatures by diffusing the heat to an external environment.

The heat dissipation structure may be formed so as to include a plate serving as a body, a heat pipe, and a heat sink, all of which may be coupled with each other. In this case, as the size of the plate increases, it may be difficult to retain a requisite degree of uniform flatness. However, when flatness is not uniform, the heat dissipation structure may be separated from a heat-generating component during installation, and/or may cause the component to warp due to insufficient cooling.

When the heat dissipation structure is assembled on a circuit board on which a heat generating component (e.g., an application processor (AP), a communication processor (CP), or a power management integrated circuit (PMIC)) or a shield can is disposed, there may be insufficient coupling with the circuit board at a specified position, due to the lifting phenomenon caused by different flatness of the heat dissipation structure itself, and/or warping caused by heat generated from the heat generating component. When lifting occurs, heat concentration in the component may result, because of insufficient heat dissipation. For example, a "hot spot" phenomenon may occur, and/or a shielding may be weakened. Heat dissipation may be reduced or ineffective for a heat dissipation structure, such as a shielding wall.

SUMMARY

According to certain embodiments of the disclosure, an electronic device is provided that includes a plate that compensates for the flatness of a heat dissipation module.

According to certain embodiments of the disclosure, an electronic device may be provided that includes a plate that reinforces a shielding function by increasing a bonding force between a heat dissipation module and a circuit board.

The objects to be achieved in the disclosure are not limited to what has been described above, and may be variously extended without departing from the scope of the disclosure.

According to certain embodiments of the disclosure, an electronic device includes: a first housing; a display disposed within the first housing; a printed circuit board disposed within the first housing; a heat dissipation plate disposed to face the printed circuit board; at least one heat pipe disposed between the heat dissipation plate and the printed circuit board; and a support plate disposed between the printed circuit board and the heat dissipation plate, wherein the support plate includes: a first portion disposed so as to contact with at least a part of the at least one heat pipe; and a second portion extending from the first portion in a second direction perpendicular to a first direction in which the at least one heat pipe is disposed, the second portion coupled to at least a part of the heat dissipation plate.

According to certain embodiments of the disclosure, a support plate includes: a first portion disposed in contact with at least a part of at least one heat pipe, and a second portion extending from the first portion in a second direction perpendicular to a first direction along which the at least one heat pipe is disposed, the second portion coupled to at least a part of a heat dissipation plate.

According to certain embodiments of the disclosure, because a heat dissipation module and a printed circuit board are fixedly in close proximity with each other, a diffusion of heat generated from a heat source may be increased, and a cooling effect may be improved.

According to certain embodiments of the disclosure, because the heat dissipation module and a shield can of the printed circuit board are fixed so as to be in close contact with each other, lifting of the heat dissipation module away from the heat generating component may be reduced or alleviated, thereby improving a shielding function.

DETAILED DESCRIPTION

Figure 1:
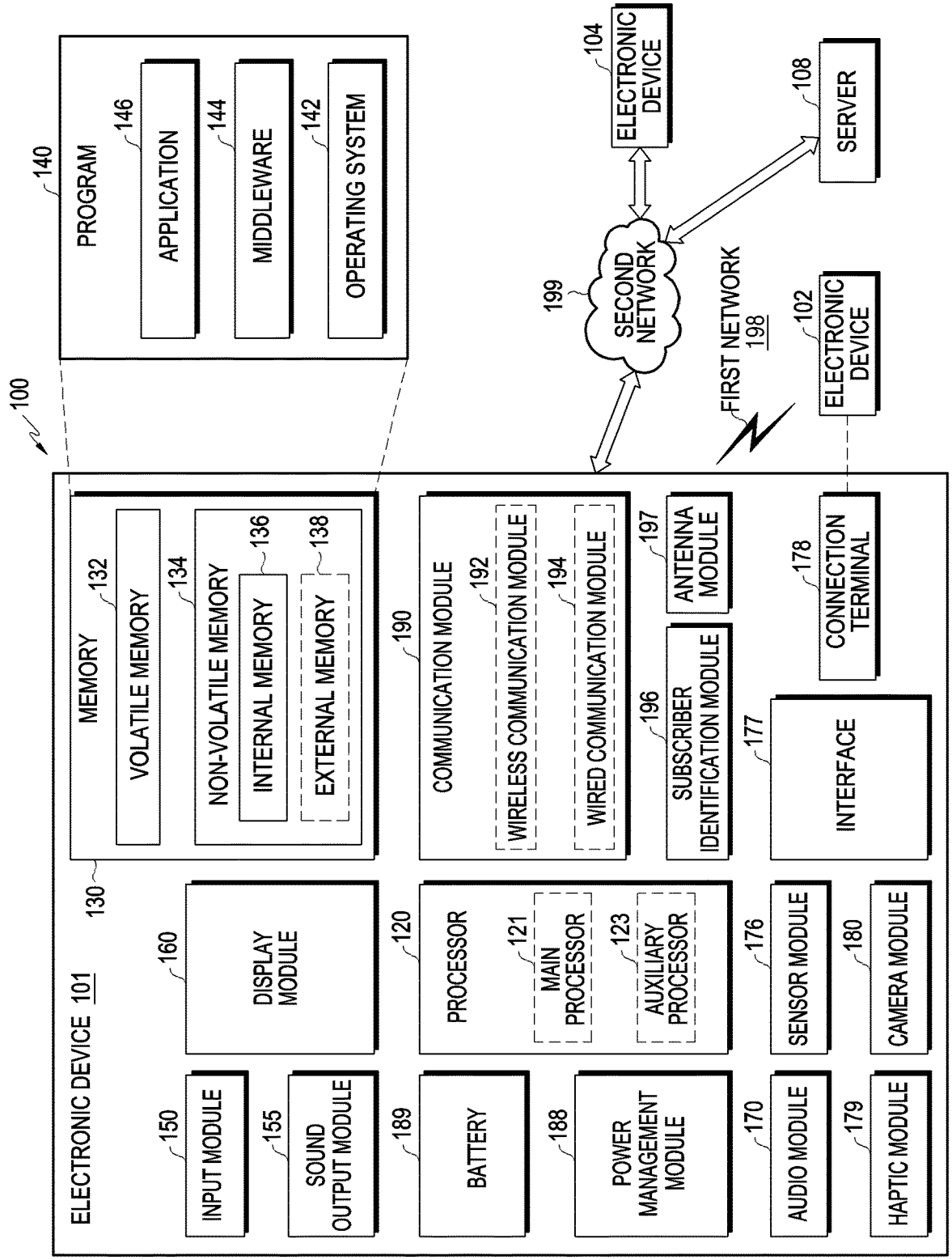
FIG. 1 is a block diagram illustrating an electronic device in a network environment according to certain embodiments of the disclosure.

FIG. 1 is a block diagram illustrating an electronic device 101 in a network environment 100 according to certain embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element implemented using a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to certain embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with certain embodiments of the disclosure, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

According to certain embodiments, each component (e.g., a module or a program) of the above-described components may include a single entity or multiple entities, and some of the multiple entities may be separately disposed in different components. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

Figure 2:
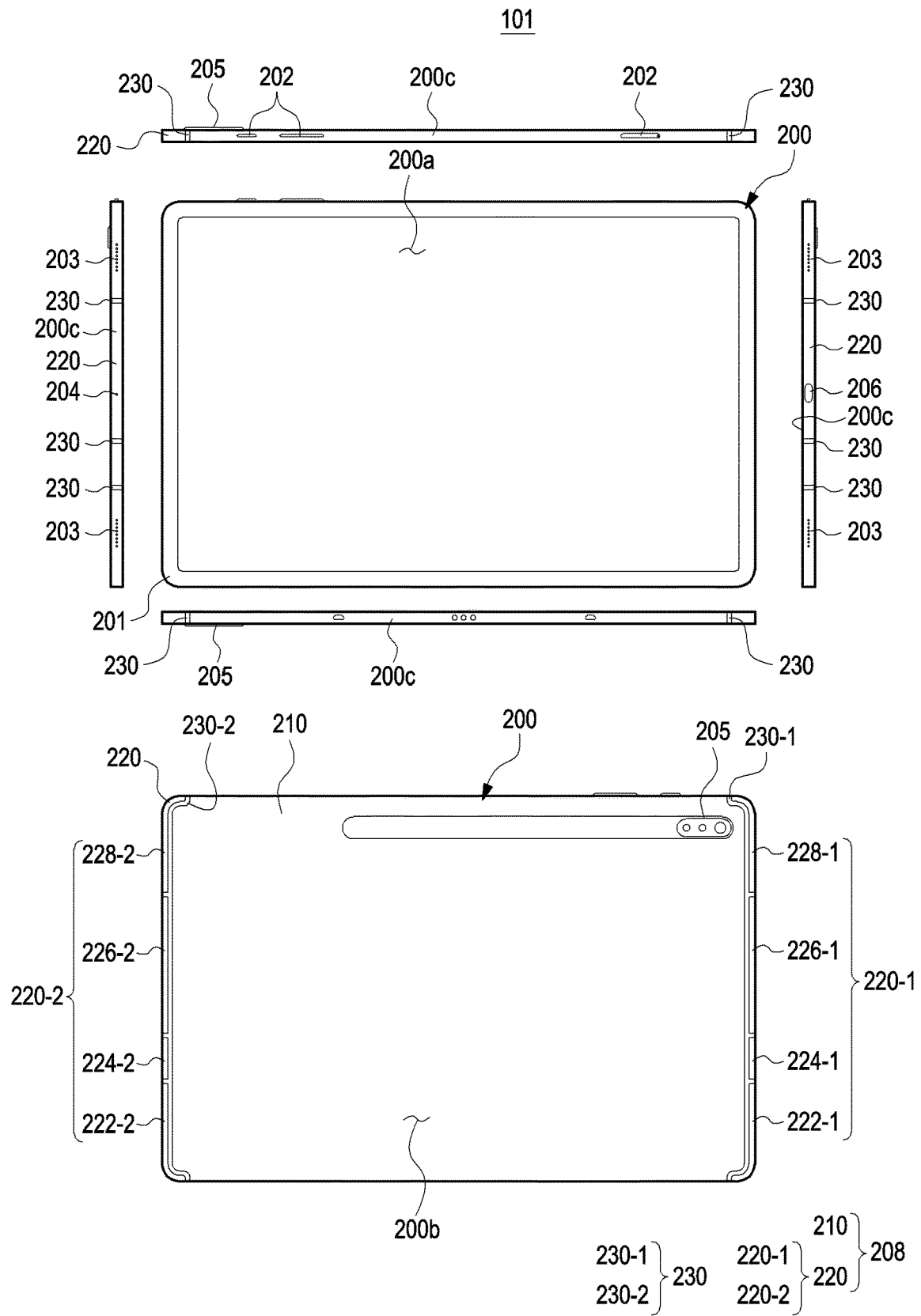
FIG. 2 is a plan view illustrating an electronic device according to certain embodiments of the disclosure.
Figure 3A:
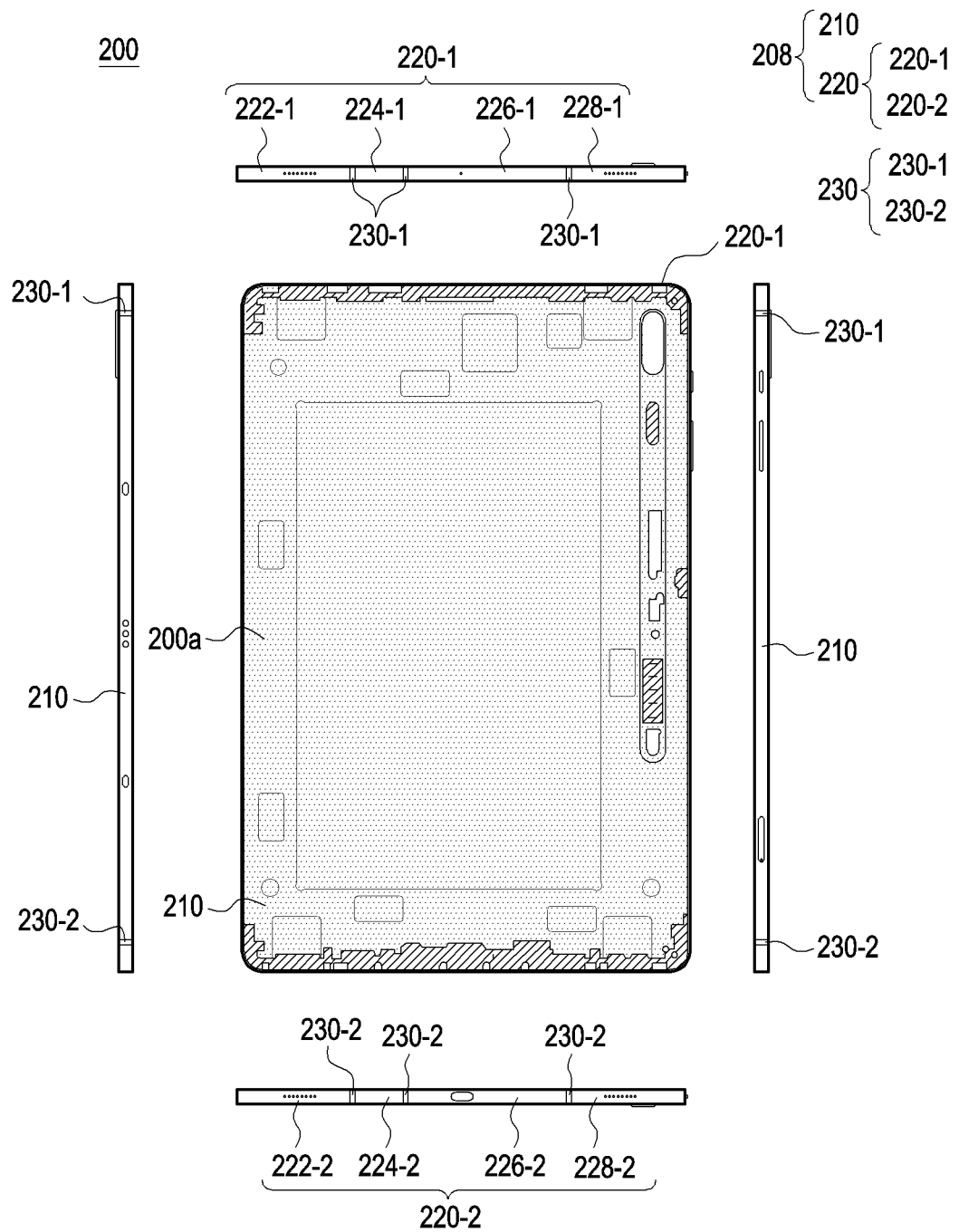
FIGS. 3A and 3B are plan views illustrating a housing according to certain embodiments of the disclosure.
Figure 3B:
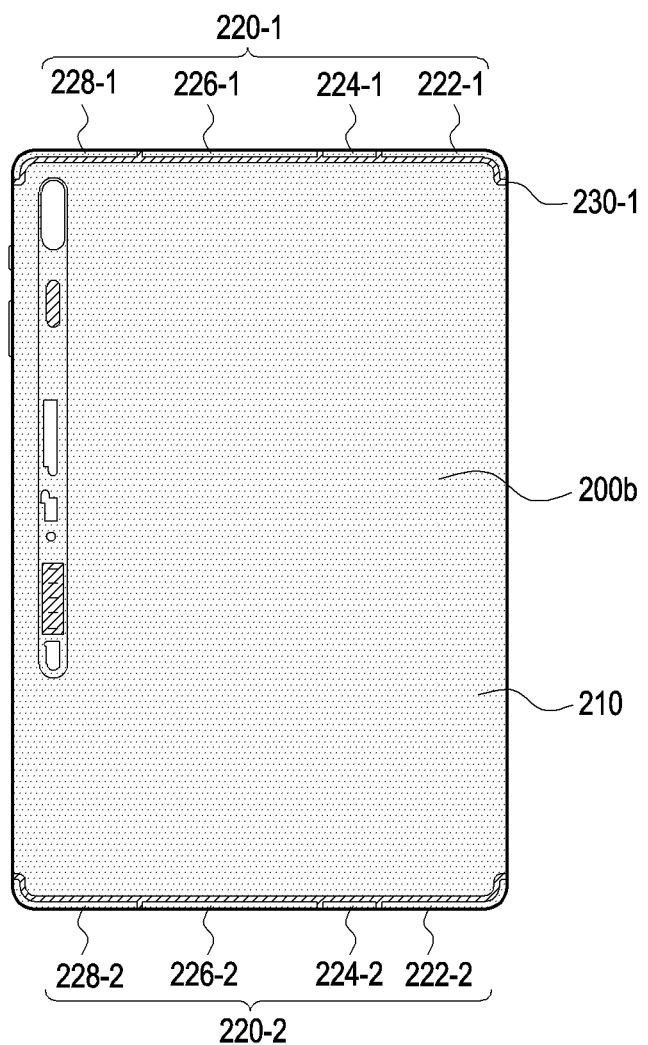

FIG. 2 is a plan view illustrating an electronic device according to certain embodiments of the disclosure. FIGS. 3A and 3B are plan views illustrating a housing according to certain embodiments of the disclosure.

Referring to FIGS. 2, 3A and 3B, the electronic device 101 may be a portable electronic device (e.g., a tablet). The electronic device 101 may include a housing 200 including a metal region 208 and a resin region 230.

According to certain embodiments, the housing 200 may include a front surface 200a, a rear surface 200b, and a side surface 200c surrounding a space formed between the front surface 200a and the rear surface 200b. According to an embodiment, the front surface 200a may include a front plate which may be at least partially substantially transparent. For example, the front surface 200a of the housing 200 may include a glass plate or polymer plate including various coating layers. According to an embodiment, the rear surface 200b and/or the side surface 200c may be formed of metal. According to an embodiment, the front 200a, the rear surface 200b, and/or the side surface 200c of the housing 200 may be interpreted as the front surface 200a, the rear surface 200b, and/or the side surface 200c of the electronic device 101.

According to certain embodiments, the metal region 208 may include a first metal region 210 and a second metal region 220. According to an embodiment, the metal region 208 may include at least one of aluminum, stainless steel, or magnesium. According to an embodiment, the second metal region 220 may be spaced apart from the first metal region 210.

According to certain embodiments, the first metal region 210 may support components (e.g., a battery (the battery 189 of FIG. 1) and the display module 160 of FIG. 1) of the electronic device 101. According to an embodiment, the first metal region 210 may form at least a part of a periphery of the electronic device 101. For example, the first metal region 210 may form at least parts of the rear surface 200b and the side surface 200c.

According to certain embodiments, the second metal region 220 may also function as an antenna. For example, the second metal region 220 may be electrically coupled to an antenna module (e.g., the antenna module 197 of FIG. 1) so as to transmit or receive electromagnetic waves.

According to certain embodiments, the second metal region 220 may form at least a part of the periphery of the electronic device 101. For example, the second metal region 220 may form at least a part of the side surface 200c of the housing 200.

According to certain embodiments, the second metal region 220 may be formed so as to include a plurality of pieces. According to an embodiment, the second metal region 220 may be disposed at the front and rear of the housing 200. For example, the second metal region 220 may include a front second metal region 220-1 located on the front of the housing 200 and a rear second metal region 220-2 spaced apart from the front second metal region 220-1.

According to certain embodiments, the second metal region 220 may include a plurality of second metal regions separated from each other by the resin region 230. For example, the front second metal region 220-1 and the rear second metal region 220-2 of the second metal region 220 may be separated into a plurality of antennas to perform the transmission and reception functions. According to an embodiment, the front second metal region 220-1 may include at least one of a $(2\text{-}1)^{th}$ metal region 222-1, a $(2\text{-}2)^{th}$ metal region 224-1, a $(2\text{-}3)^{th}$ metal region 226-1, or a $(2\text{-}4)^{th}$ metal region 228-1, and the rear second metal region 220-2 may include at least one of a $(2\text{-}5)^{th}$ metal region 222-2, a $(2\text{-}6)^{th}$ metal region 224-2, a $(2\text{-}7)^{th}$ metal region 226-2, or a $(2\text{-}8)^{th}$ metal region 228-2.

According to certain embodiments, the resin region 230 may couple the first metal region 210 to the second metal region 220. According to an embodiment, at least a part of the resin region 230 may be disposed between the first metal region 210 and the second metal region 220. According to an embodiment, the resin region 230 may form at least a part of the rear surface 200b and/or at least a part of the side surface 200c of the housing 200.

According to certain embodiments, the resin region 230 may be formed so as to include a plurality of pieces. According to an embodiment, the resin region 230 may be located at the front and rear of the housing 200. For example, the resin region 230 may include a front resin region 230-1 disposed between the front second metal region 220-1 and the first metal region 210, and a rear resin region 230-2 disposed between the rear second metal region 220-2 and the first metal region 210.

According to certain embodiments, the electronic device 101 may include a display 201, key input structures 202, audio modules 203 and 204, a light emitting element (not shown), a camera module 205, a connector hole 206, and/or a sensor module (not shown). In some embodiments, the electronic device 101 may omit at least one (e.g., the connector hole 206) of the components or may additionally include another component.

According to certain embodiments, the display 201 (e.g., the display module 160 of FIG. 1) may be coupled with or located in the vicinity of a touch sensing circuit, a pressure sensor configured to measure the intensity (pressure) of a touch, and/or a digitizer configured to detect a stylus pen via magnetic field. According to an embodiment, the display 201 may be visually exposed and thus visible through the front surface 200a of the housing 200.

According to an embodiment, the key input structures 202 (e.g., the input module 150 or the sensor module 176 of FIG. 1) may be disposed on the side surface 200c of the housing 200. In another embodiment, the electronic device 101 may omit at least some of the above-mentioned key input structures 202, and a key input structure 202 that is omitted may be implemented in another form such as a soft key displayed on the display 201.

According to certain embodiments, the light emitting element (not shown) may be disposed, for example, on the front surface 200a and/or the rear surface 200b of the housing 200. The light emitting element (not shown) may provide, for example, state information about the electronic device 101 by light. In another embodiment, the light emitting element (not shown) may provide, for example, a light source operating in conjunction with an operation of a front camera module (not shown) or a rear camera module 205. The light emitting element (not shown) may include, for example, a light emitting diode (LED), an IR LED, and/or a xenon lamp.

According to certain embodiments, the camera module 205 (e.g., the camera module 180 of FIG. 1) may include one or more lenses, an image sensor, an image signal processor, and/or a flash. The flash may include, for example, an LED or a xenon lamp. In some embodiments, two or more lenses (an IR camera, a wide angle lens, and a telephoto lens) and image sensors may be disposed on one surface of the electronic device 101. According to an embodiment, the front camera module included in the electronic device 101 (not shown) (e.g., an under display camera "UDC") may be disposed on the front surface 200a of the electronic device 101, and the rear camera module 205 may be disposed on the rear surface 200b of the electronic device 101.

According to certain embodiments, the connector hole 206 (e.g., the connection terminal 178 of FIG. 1) may accommodate, for example, a connector (e.g., a USB connector) for transmitting and receiving power and/or data to and from an external electronic device, or a connector (e.g., an earphone jack) for transmitting and receiving audio signals to and from an external electronic device.

According to an embodiment of the disclosure, a sensor module (e.g., the sensor module 176 of FIG. 1) may generate, for example, an electrical signal or a data value corresponding to an internal operating state or external environmental state of the electronic device 101. The sensor module (not shown) may include, for example, a first sensor module (not shown) (e.g., a proximity sensor) and/or a second sensor module (not shown) (e.g., a fingerprint sensor), which is disposed on the front surface 200a of the housing 200, and/or a third sensor module (not shown) (e.g., a heart rate monitor (HRM) sensor) and/or a fourth sensor module (not shown) (e.g., a fingerprint sensor), which is disposed on the rear surface 200b of the housing 200. In some embodiments (not shown), the fingerprint sensors may be disposed on the rear surface 200b as well as the front surface 200a (e.g., the display 201) of the housing 200. The electronic device 101 may include a sensor module (not shown), including, for example, at least one of a gesture sensor, a gyro sensor, a barometric pressure sensor, a magnetic sensor, an acceleration sensor, a grip sensor, a color sensor, an IR sensor, a biometric sensor, a temperature sensor, a humidity sensor, or an illuminance sensor (not shown).

Figure 4:
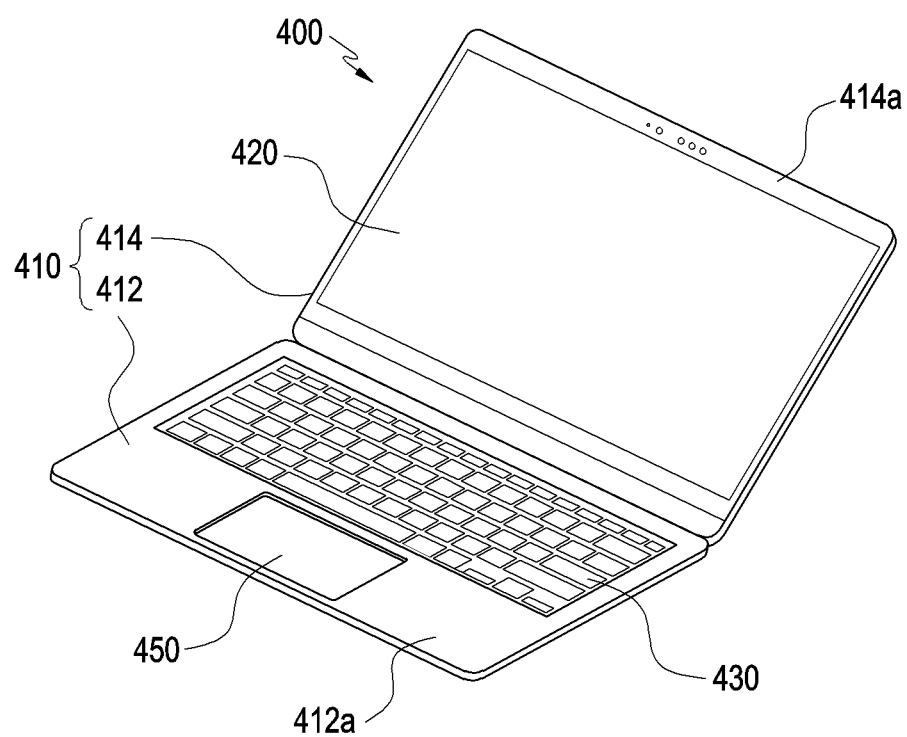
FIG. 4 is a front perspective view illustrating another electronic device according to certain embodiments of the disclosure.

FIG. 4 is a front perspective view illustrating another electronic device according to certain embodiments of the disclosure.

Referring to FIG. 4, an electronic device 400 may include a housing 410, a display 420, and a touch pad module 450. According to an embodiment, the electronic device 400 may include a laptop computer, a notebook computer, or a portable terminal. The configuration of the electronic device 400 of FIG. 4 may be wholly or partially identical to that of the electronic device 101 of FIG. 1.

According to certain embodiments, the housing 410 may form at least a part of the exterior of the electronic device 400 or support a component (e.g., the touch pad module 450) of the electronic device 400. For example, the housing 410 may accommodate at least one of the display 420, an input device 430, and the touch pad module 450.

According to certain embodiments, the electronic device 400 may be disposed in an open or closed state. For example, the housing 410 may include a first housing 412 and a second housing 414 that is rotatably coupled to the first housing 412. According to an embodiment, the electronic device 400 may include a hinge module (not shown) coupled to the housing 410. For example, the hinge module (not shown) may be coupled to the first housing 412 and the second housing 414. According to an embodiment, the first housing 412 may be configured to rotate within a specified angle range (e.g., 0 to about 180 degrees) with respect to the second housing 414. For example, a first front surface 412a of the first housing 410 may be rotated so as to at least partially face a second front surface 414a of the second housing 414.

According to certain embodiments, the housing 410 may be formed of a metal material or non-metal material having a selected rigidity. According to an embodiment, at least a part of the electronic device 400, which is formed of the metal material, may provide a ground plane, and may be electrically coupled to a ground line formed on a printed circuit board (not shown). For example, the housing 410 may be electrically coupled to the printed circuit board through a capacitive component. The housing 410 may include a heat dissipation module (e.g., a heat dissipation module 500 of FIG. 5A) or a printed circuit board (e.g., a circuit board 800 of FIG. 8A), and include a support plate (e.g., a support plate 600 of FIG. 6A) to reinforce a bonding between the heat dissipation module and the printed circuit board.

According to certain embodiments, the display 420 may include a flexible display in which at least a partial area is deformable, so as to form a flat surface and/or curved surface. For example, the display 420 may be a foldable or rollable display. The configuration of the display 420 may be wholly or partially identical to that of the display module 160 of FIG. 1. According to an embodiment, at least a part of the display 420 may be disposed within the second housing 414. For example, at least a part of the display 420 may be visually exposed to an exterior environment of the electronic device 400 through the second housing 414.

According to certain embodiments, the display 420 may be coupled to or located within a vicinity of a touch sensing circuit, a pressure sensor capable of measuring the intensity (pressure) of a touch, and/or a digitizer configured to detect a stylus pen of a magnetic field type.

According to certain embodiments, the input device 430 may detect a user input (e.g., an applied pressure). According to an embodiment, the input device 430 may be disposed on the first housing 412. According to an embodiment, in the closed state of the electronic device 400, at least a part of the input device 430 may face the display 420. The configuration of the input device 430 of FIG. 4 may be wholly or partially identical to that of the input module 150 of FIG. 1. For example, the input device 430 may include a keyboard.

According to certain embodiments, the touch pad module 450 may be configured to detect or receive a user input. According to an embodiment, the touch pad module 450 may include a capacitive touch sensor, a resistive touch sensor, an optical touch sensor, or a surface acoustic wave touch sensor. For example, the touch pad module 450 may detect current, pressure, light, and/or vibration caused by an input applied to the touch pad module 450 by a user, and a processor (e.g., the processor 120 of FIG. 1) and/or the touch pad module 450 may determine the user input, based on changes in the sensed current, pressure, light, and/or vibration.

According to certain embodiments, the touch pad module 450 may be accommodated in the housing 410. For example, the touch pad module 450 may be coupled to the first housing 412, and at least a part of the touch pad module 450 may be exposed to the outside of the first housing 412. According to an embodiment, the touch pad module 450 may be disposed adjacent to the input device 430. According to an embodiment, in the closed state of the electronic device 400, at least a part of the touch pad module 450 may be disposed so as to face the display 420. The configuration of the touch pad module 450 may be wholly or partially identical to that of the input module 150 of FIG. 1.

Figure 5A:
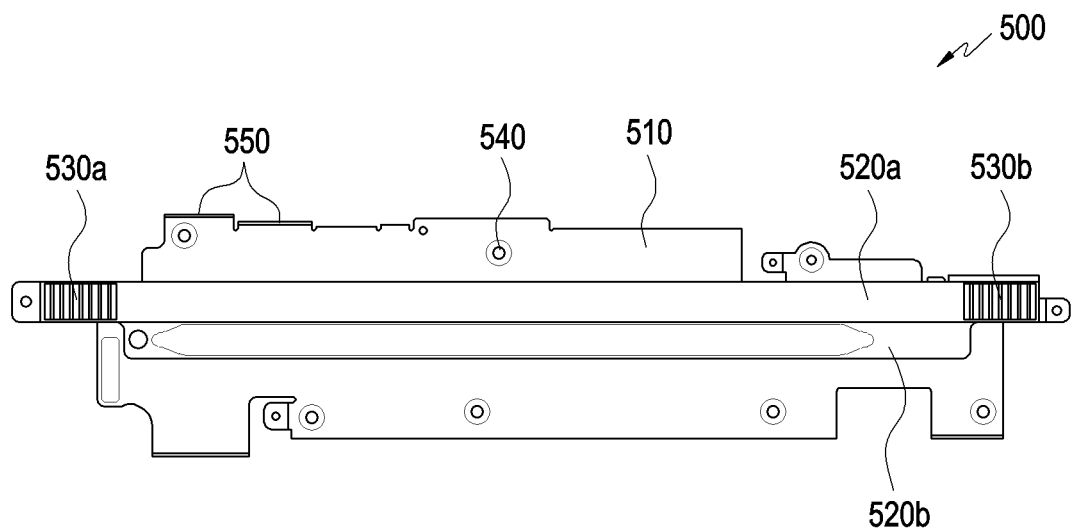
FIG. 5A is a plan view illustrating a heat dissipation module according to certain embodiments of the disclosure.
Figure 5B:
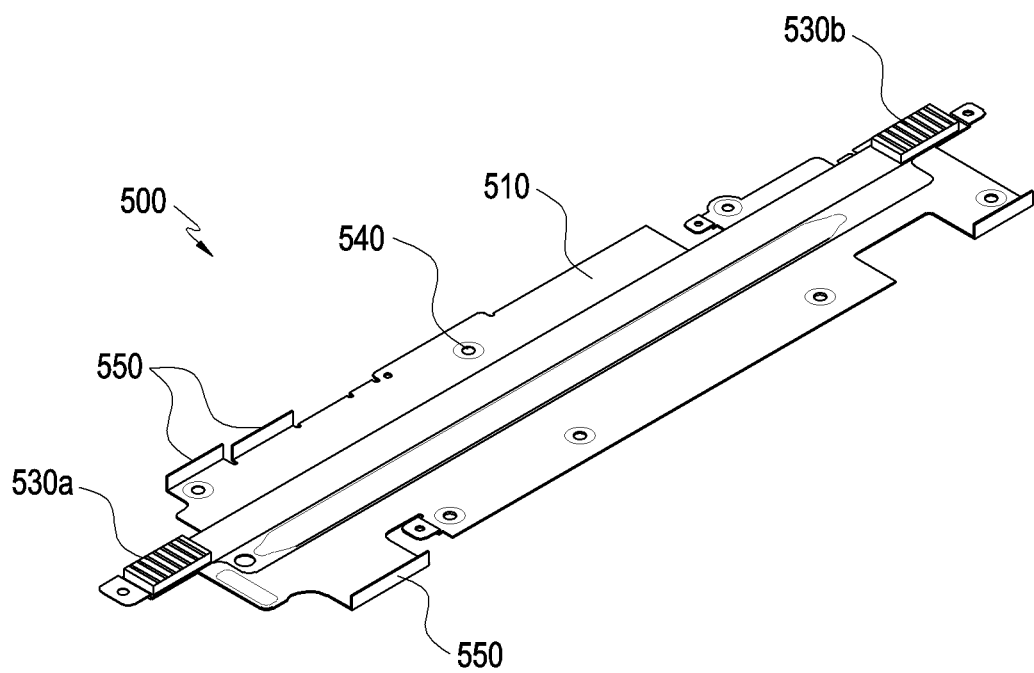
FIG. 5B is a perspective view illustrating a heat dissipation module according to certain embodiments of the disclosure.

FIG. 5A is a plan view illustrating a heat dissipation module according to certain embodiments of the disclosure. FIG. 5B is a perspective view illustrating the heat dissipation module according to certain embodiments of the disclosure.

Referring to FIGS. 5A and 5B, an electronic device (e.g., the electronic devices 101 and 400 of FIGS. 1 to 4) may include a heat dissipation module 500. The heat dissipation module 500 may include at least one of a heat dissipation plate 510, heat pipes 520a and 520b, heat sinks 530a and 530b, or a sidewall structure 550.

According to certain embodiments, the heat dissipation module 500 may be formed in a structure corresponding to a shape of a circuit board included in the electronic device 101. At least a part of the heat dissipation plate 510 may be coupled to at least some parts of the heat pipes 520a and 520b. At least some parts of the heat pipes 520a and 520b may be coupled to at least some parts of the heat sinks 530a and 530b. For example, at least one heat pipe 520a or 520b may be disposed at the center of the heat dissipation plate 510. The heat sinks 530a and 530b may be disposed at both ends of the at least one heat pipe 520a or 520b.

According to certain embodiments, the heat pipes 520a and 520b may diffuse heat generated from a heat source or a shield can included in the circuit board contacting with the heat pipes 520a and 520b, and the heat dissipation plate 510 may fix the heat pipes 520a and 520b to be in contact with the heat source or the shield can. The heat sinks 530a and 530b may diffuse heat transferred from the heat pipes 520a and 520b. The heat dissipation plate 510 may include at least one fastening hole 540 for connection to the circuit board, and may be coupled to the circuit board by fixing a screw or a nail in the fastening hole 540. The sidewall structure 550 may be coupled with a clip structure (e.g., a clip structure 810d of FIGS. 8A and 8B) disposed on the circuit board (e.g., a circuit board 800 of FIG. 8A). The sidewall structure 550 may be coupled with the circuit board to reinforce functional shielding in blocking noise or electromagnetic waves.

According to certain embodiments, the heat dissipation plate 510 and the heat pipes 520a and 520b may be formed of a metal material with a sufficient degree of heat transference. For example, the heat dissipation plate 510 and the heat pipes 520a and 520b may be formed of copper, aluminum, or stainless steel. Flatness may further improve the operational qualities of the heat dissipation plate 510 and the heat pipes 520a and 520b. Error tolerance in flatness for long parts of the heat pipes 520a and 520b and the heat dissipation plate 510 should be about 0.6 mm or less, and error tolerance for short parts thereof should be about 0.3 mm or less, so as to prevent lifting or warping after coupling with the circuit board. However, as the size of the heat dissipation module 500 increases, it may become difficult to manage flatness during manufacturing, and further, manufacturing resource waste may increase due to losses at the heat dissipation module when manufactured with a flatness outside the accepted tolerance range. Therefore, there is a need to devise a new configuration to compensate for and/or implement flatness.

Figure 6A:
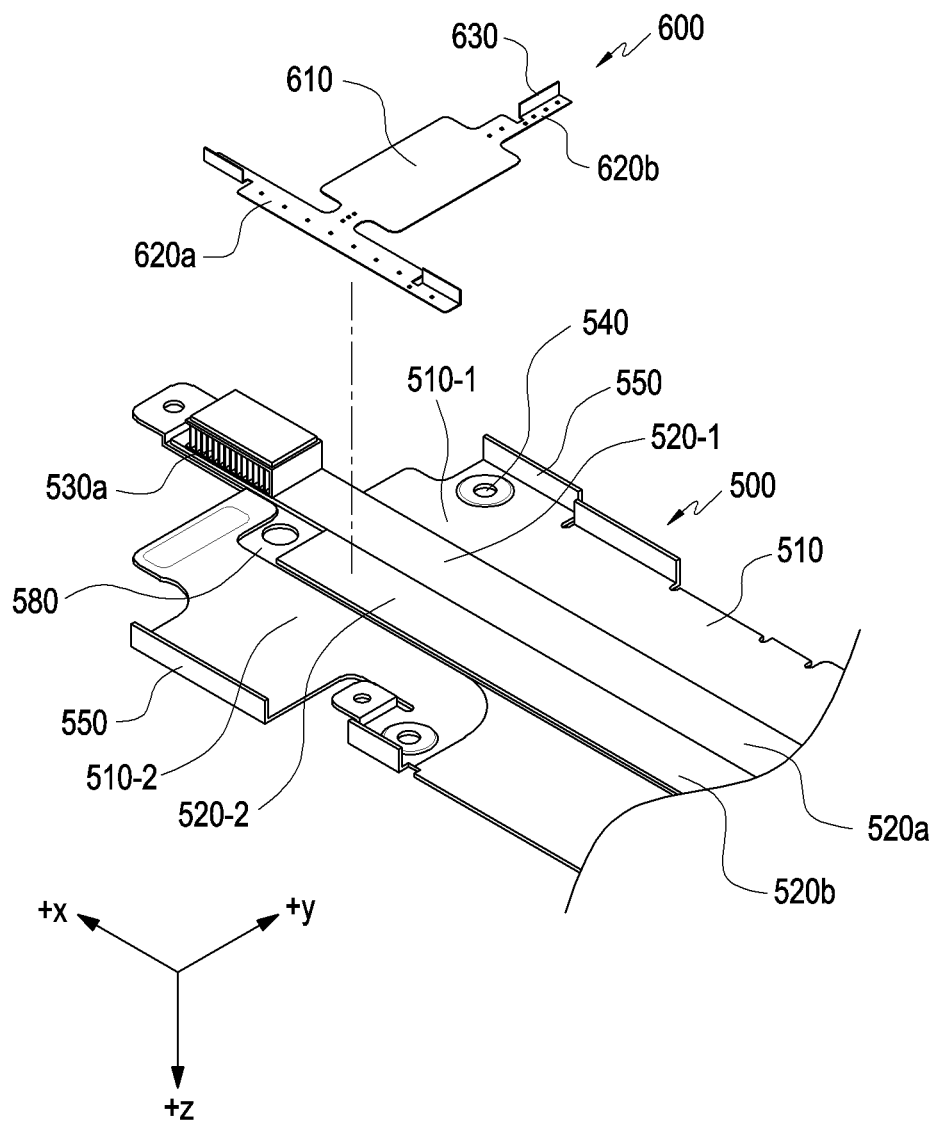
FIG. 6A is a perspective view illustrating a support plate and a part of a heat dissipation module according to certain embodiments of the disclosure.
Figure 6B:
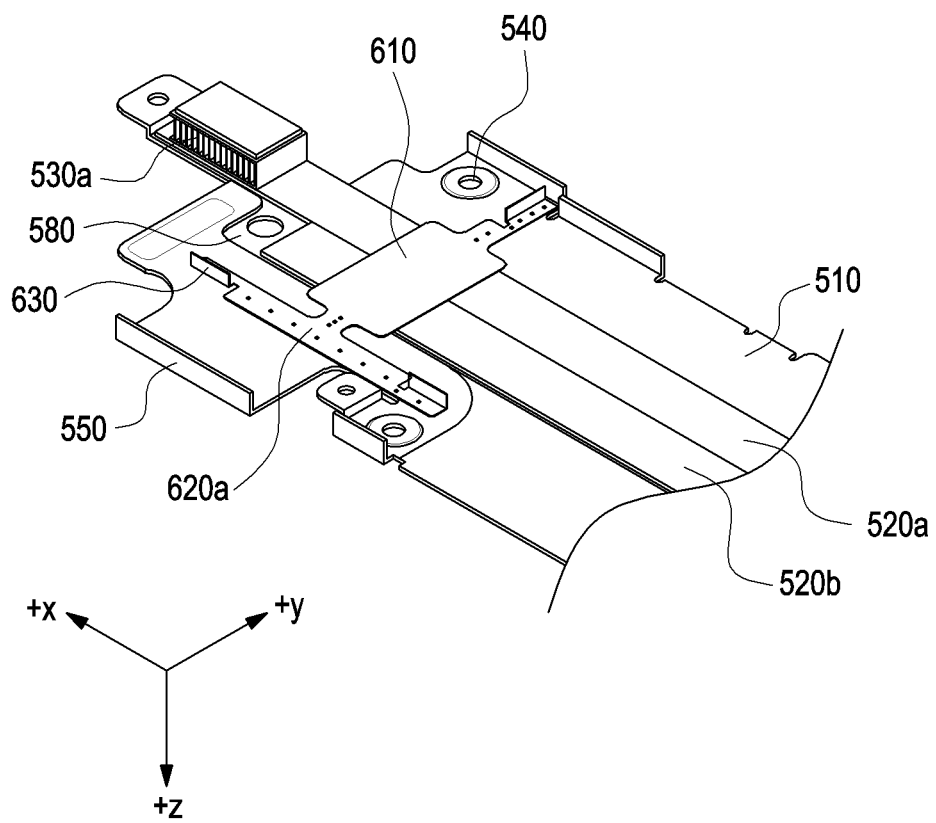
FIG. 6B is a perspective view illustrating a part of a heat dissipation module coupled with a support plate according to certain embodiments of the disclosure.
Figure 7A:
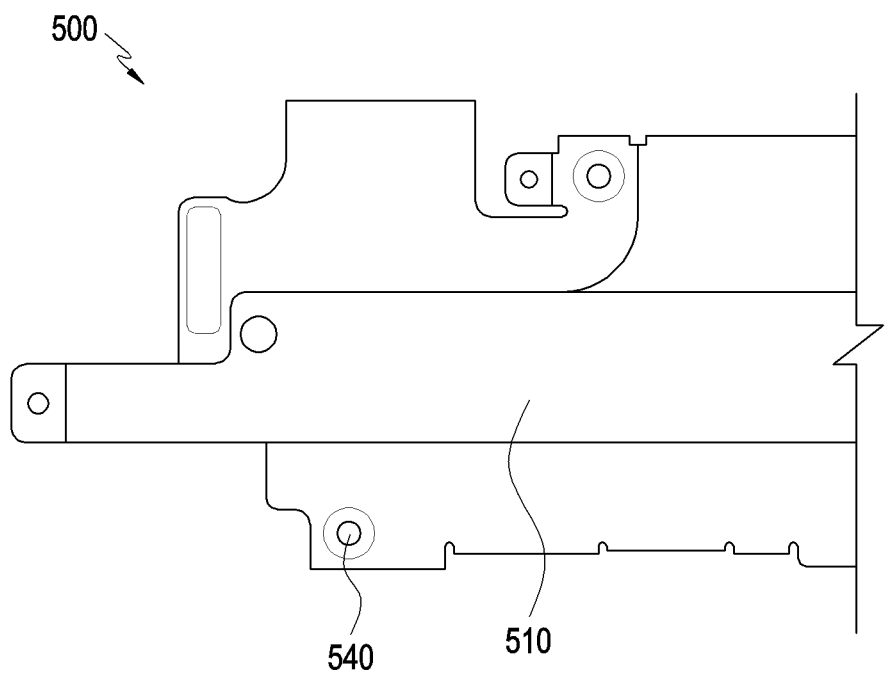
FIG. 7A is a plan view illustrating a heat dissipation module coupled with a support plate, viewed from a first surface on which the support plate is disposed according to certain embodiments of the disclosure.
Figure 7B:
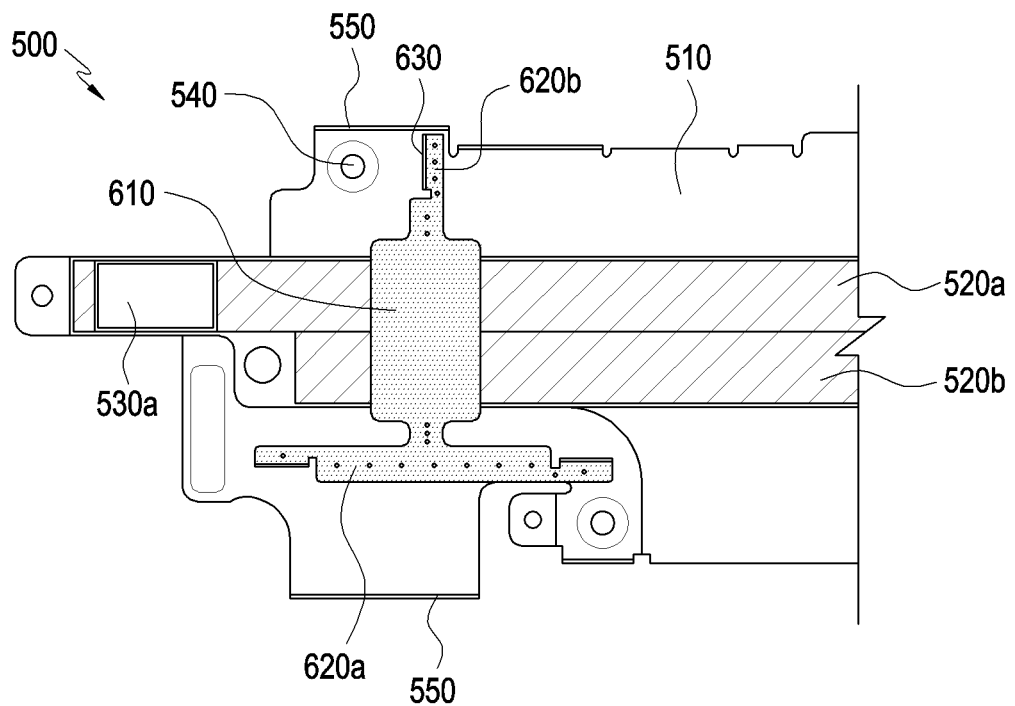
FIG. 7B is a plan view illustrating a part of the heat dissipation module coupled with the support plate, viewed from a second surface opposite to the first surface according to certain embodiments of the disclosure.

FIG. 6A is a perspective view illustrating a support plate and a part of a heat dissipation module according to certain embodiments of the disclosure. FIG. 6B is a perspective view illustrating a part of the heat dissipation module coupled with the support plate according to certain embodiments of the disclosure. FIG. 7A is a plan view illustrating a part of the heat dissipation module coupled with the support plate, viewed from a first surface on which the support plate is disposed according to certain embodiments of the disclosure. FIG. 7B is a plan view of a part of the heat dissipation module coupled with the support plate, viewed from a second surface opposite to the first surface according to certain embodiments of the disclosure.

Referring to FIGS. 6A to 7B, an electronic device (e.g., the electronic devices 101 and 400 of FIGS. 1 to 7B) may include the heat dissipation module 500 and a support plate 600. The configuration of the heat dissipation module 500 of FIGS. 6A to 7B may be wholly or partially identical to that of the heat dissipation module 500 of FIGS. 5A and 5B, and a repetitive description thereof will be omitted.

According to certain embodiments, the support plate 600 may be disposed on a first surface, on which the heat pipes 520a and 520b and the heat sink 530a of the heat dissipation module 500 are also disposed. The support plate 600 may include at least one first portion 610 disposed at least partially in contact with at least one heat pipe 520a or 520b, at least one second portion 620a and 620b disposed in contact with at least a part of the heat dissipation plate 510, and at least one wall structure 630 at least partially coupled with the circuit board. According to an embodiment, the support plate 600 may include a hole structure formed in the first portion 610 and/or the second portions 620a and 620b.

According to certain embodiments, the second portions 620a and 620b may extend from the first portion 610 in a second direction (a y-axis direction in the drawings) substantially perpendicular to a first direction (an x-axis direction in the drawings) along which the heat pipes 520a and 520b are disposed, and may be coupled to at least a part of the heat dissipation plate 510. The wall structure 630 may extend from the first portion 610 in a third direction (a z-axis direction in the drawings) that is substantially perpendicular to both the first direction (x-axis direction) and the second direction (y-axis direction), and may be at least partially coupled with the circuit board. When the wall structure 630 is at least partially coupled with the circuit board, at least one of spot welding, solder pasting, or clipping may be used.

According to certain embodiments, the support plate 600 may be formed of a metal having a greater rigidity than the material of the heat dissipation plate 510, so as to prevent deformation. In addition, the metal may be a material that conducts heat at a sufficient level for operation of the electronic device. For example, stainless steel or aluminum may be used. The support plate 600 may be formed by molding, and may be formed in various shapes so as to include the first portion 610, the second portions 620a and 620b, and the wall structure 630. For example, the support plate 600 may be in the shape of "T" or "I" as illustrated.

According to certain embodiments, the heat dissipation plate 510 may include a recess structure 580 in which the heat pipes 520a and 520b are mounted. For example, the recess structure 580 may include formation of a groove or hole structure recessed in the third direction (e.g., a +z direction). In a state in which the heat pipes 520a and 520b are disposed in the recess structure 580, surfaces 510-1 and 510-2 of the heat pipes 520a and 520b, which contact the support plate 600, may substantially have a same height as surfaces 520-1 and 520-2 of the heat dissipation plate 510, which contact the support plate 600. For example, a flat surface of the support plate 600 may be disposed in close contact with the heat pipes 520a and 520b and the heat dissipation plate 510, to improve heat transfer efficiency.

Referring to FIG. 6B or FIG. 7B, the heat dissipation module 500 and the support plate 600 may be coupled with each other by at least one of spot welding or solder pasting. According to an embodiment, the support plate 600 may be disposed at any position of the heat dissipation module 500.

Figure 8A:
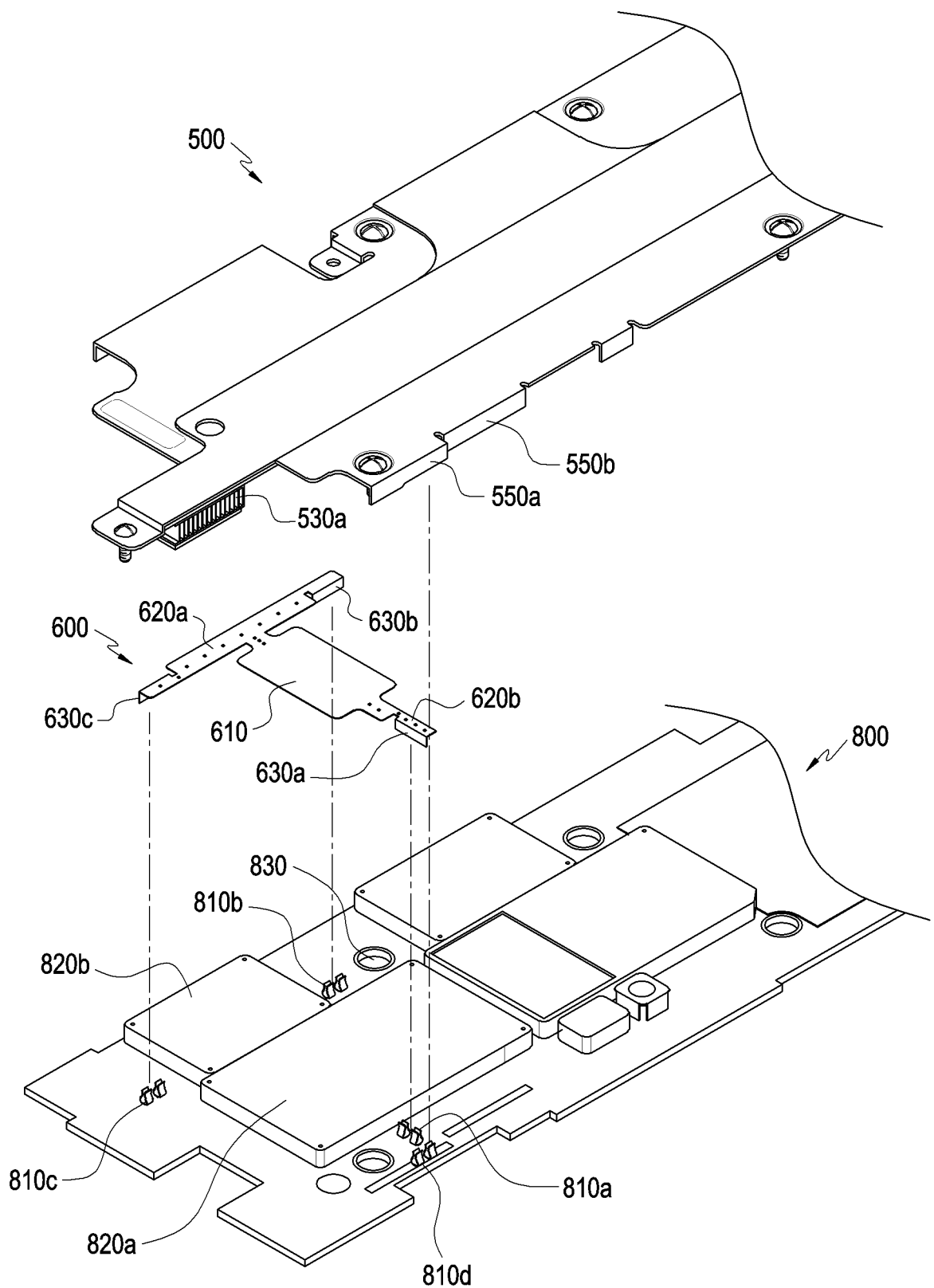
FIG. 8A is a perspective view illustrating parts of a heat dissipation module, a support plate, and a circuit board according to certain embodiments of the disclosure.
Figure 8B:
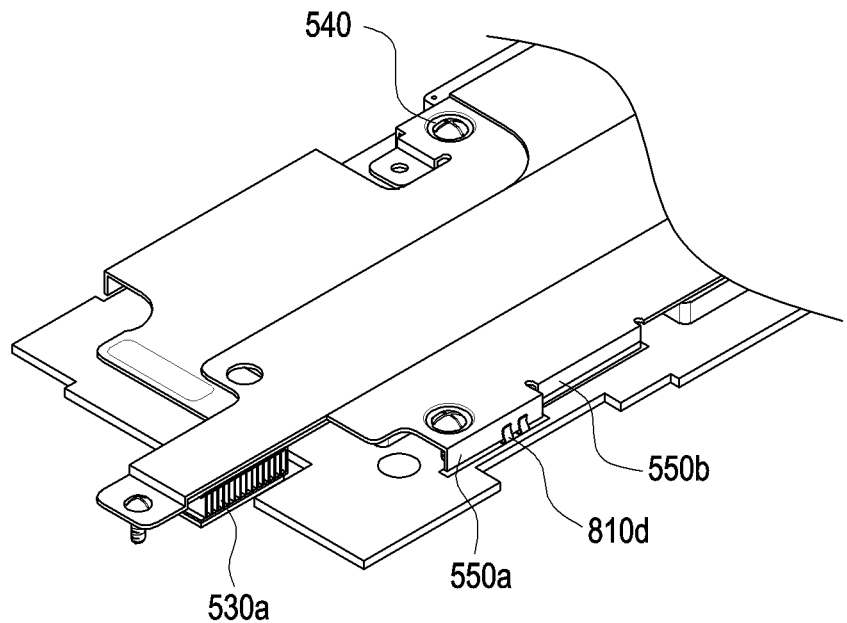
FIG. 8B is a perspective view illustrating a part of a structure in which a heat dissipation module, a support plate, and a circuit board are coupled with each other according to certain embodiments of the disclosure.
Figure 8C:
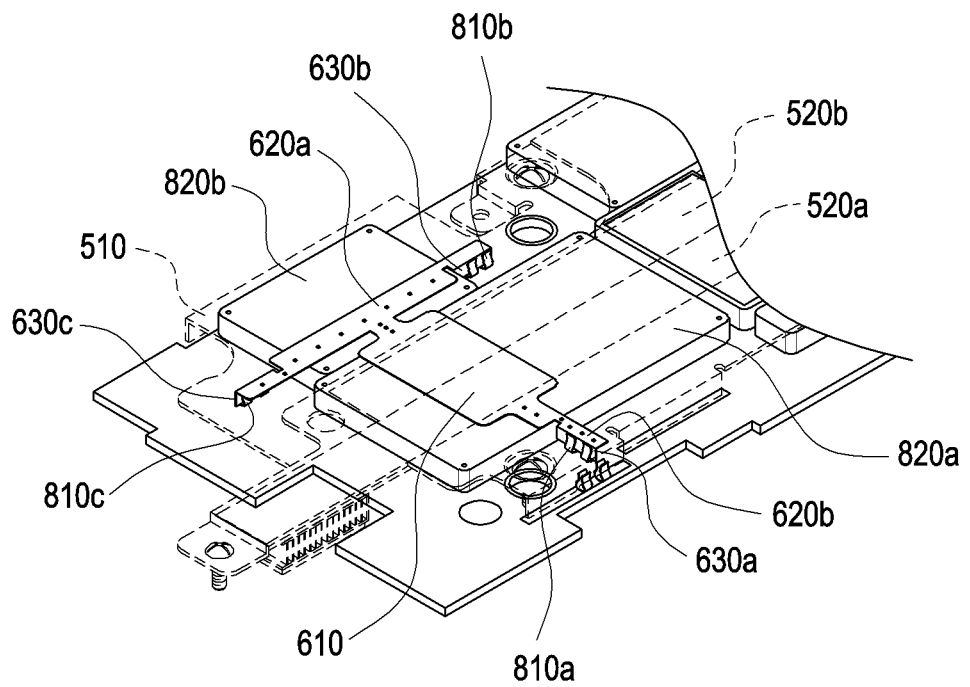
FIG. 8C is a projection view illustrating a part of a structure in which a heat dissipation module, a support plate, and a circuit board are coupled with each other according to certain embodiments of the disclosure.

FIG. 8A is a perspective view illustrating parts of a heat dissipation module, a support plate, and a circuit board according to certain embodiments of the disclosure. FIG. 8B is a perspective view illustrating a part of a structure in which the heat dissipation module, the support plate, and the circuit board are coupled with each other according to certain embodiments of the disclosure. FIG. 8C is a projection view illustrating a part of the structure in which the heat dissipation module, the support plate, and the circuit board are coupled with each other according to certain embodiments of the disclosure.

Referring to FIGS. 8A, 8B and 8C, an electronic device (e.g., the electronic devices 101 and 400 of FIGS. 1 to 8C) may include the heat dissipation module 500, the support plate 600, and the circuit board 800. The configurations of the heat dissipation module 500 and the support plate 600 of FIGS. 8A, 8B and 8C may be wholly or partially identical to those of the heat dissipation module 500 of FIGS. 5A to 7B and the support plate 600 of FIGS. 6A to 7B, respectively, and as such, repetitive descriptions of the same will be omitted.

According to certain embodiments, the circuit board 800 may be referred to as a printed circuit board. The circuit board 800 may include at least one electronic component and at least one shield can structure 820a and 820b covering the at least one electronic component. The circuit board 800 may include clip structures 810a to 810d which fasten to other electronic components, and at least one hole structure 830 for receiving a securing nail or a screw.

Referring to FIG. 8A, the at least one shield can structure 820a and 820b may be disposed so as to contact the first portion 610 or the at least one second portion 620a and 620b of the support plate 600. The at least one clip structure 810a to 810d may fasten to other electronic components. According to an embodiment, the first clip structures 810a, 810b and 810c may be coupled to wall structures 630a, 630b and 630c of the support plate 600, respectively. The wall structures 630a, 630b and 630c may be fixed by insertion into in grooves of the first clip structures 810a, 810b, and 810c, respectively. According to another embodiment, the second clip structure 810d may be coupled with a sidewall structure 550a of the heat dissipation module 500. A sidewall structure 550b of the heat dissipation module 500 may not be coupled with a clip structure of the circuit board 800. The first clip structures 810a, 810b and 810c, and the second clip structure 810d may be identical in structure and shape. The hole structure 830 may be coupled to the hole structure 540 of the heat dissipation module 500 via a fastening structure (e.g., a nail or a screw). One or more support plates 600 may be used to couple the heat dissipation module 500 with the circuit board 800.

Referring to FIG. 8B, the sidewall structure 550a of the heat dissipation module 500 may be coupled with the clip structure 810d of the circuit board 800. Another sidewall structure 550b may be located in a portion in which there is no clip structure. The hole structure 540 of the heat dissipation module 500 may be coupled with the hole structure 830 of the circuit board 800 via a fastening structure (e.g., a nail or a screw).

Referring to FIG. 8C, at least a part of the first portion 610 of the support plate 600 may be disposed so as to be in contact between the heat pipes 520a and 520b and the shield can structure 820a. At least a part of the second portion 620a of the support plate 600 may be disposed in contact between the heat dissipation plate 510 of the heat dissipation module 500 and the shield can structure 820b. The wall structures 630a, 630b and 630c of the support plate 600 may be coupled with the clip structures 810a, 810b and 810c of the circuit board 800, respectively.

Referring to FIGS. 8B and 8C, a face-to-face arrangement distance between the heat dissipation module 500 and the circuit board 800 coupled with each other by means of the support plate 600 may be about 0.3 mm to 0.6 mm or less.

FIGS. 9A to 9E are sectional views illustrating various methods of coupling a support plate with a heat dissipation module according to certain embodiments of the disclosure.

Referring to FIGS. 9A to 9E, an electronic device (e.g., the electronic devices 101 and 400 of FIGS. 1 to 9E) may include the heat dissipation module 500 and the support plate 600. The heat dissipation module 500 illustrated in each of FIGS. 9A to 9E may include one of heat dissipation plates 510a to 510e, one of heat pipes 910a to 910e, and a recess structure 960. The configurations of the heat dissipation module 500 and the support plates 600 may be wholly or partially identical to those of the heat dissipation module 500 of FIGS. 5A to 8C and the support plate 600 of FIGS. 6A to 8C, respectively, and thus, any repetitive descriptions of the same will be omitted.

According to certain embodiments, the heat pipes 910a to 910e may be mounted in the recess structures 960 of the heat dissipation plates 510a to 510e, respectively. Due to the recess structure 960, surfaces of the heat pipes 910a to 910e seated on the heat dissipation plates 510a to 510e may have substantially the same heights as surfaces of the heat dissipation plates 510a to 510e. For example, the support plate 600 may be disposed in close contact with the heat pipes 910a to 910e and the heat dissipation plates 510a to 510e, respectively, so as to improve heat transfer efficiency. Support plates 600a to 600e, the heat dissipation plates 510a to 510e of the heat dissipation module 500, and the heat pipes 910a to 910e may be coupled with each other so as to be in contact with each other. When the support plates 600a to 600e, the heat dissipation plates 510a to 510e, and the heat pipes 910a to 910e are coupled, they may be coupled by at least one of solder pasting or spot welding. The support plates 600a to 600e and the heat dissipation plates 510a to 510e, the support plates 600a to 600e and the heat pipes 910a to 910e, and the heat dissipation plates 510a to 510e and the heat pipes 910a to 910e may be coupled in the same method or different methods. The support plates 600a to 600e, and the heat dissipation plates 510a to 510e and the heat pipes 910a to 910e of the heat dissipation module 500 may be coupled in various manners to strengthen fixing force, to smoothly diffuse heat, and reduce or even prevent lifting and warping of the plates. Certain embodiments in which the support plates 600a to 600e, the heat dissipation plates 510a to 510e, and the heat pipes 910a to 910e are coupled are described in FIGS. 9A to 9E.

Figure 9A:
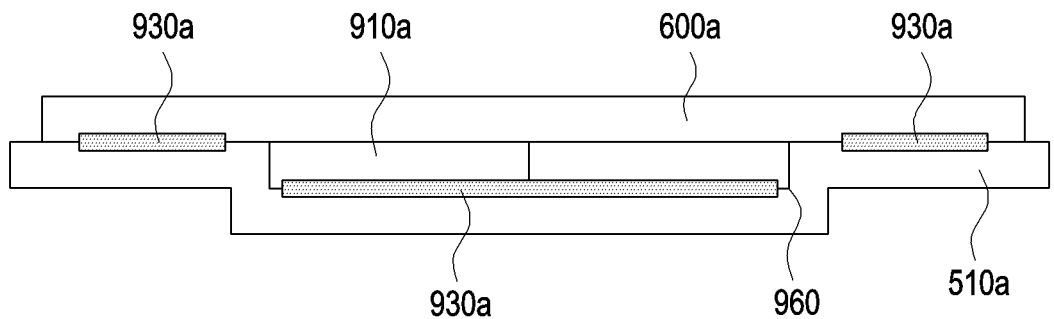
FIGS. 9A to 9E are sectional views illustrating various methods of coupling a support plate and a heat dissipation module with each other according to certain embodiments of the disclosure.

Referring to FIG. 9A, the support plate 600a may be coupled to the heat dissipation plate 510a by solder pasting 930a. At least one heat pipe 910a may be coupled to the heat dissipation plate 510a by the solder pasting 930a. In the case where the at least one heat pipe 910a is to be coupled to the support plate 600a, when the heat dissipation plate 510a and the support plate 600a are coupled by solder pasting or spot welding, the at least one heat pipe 910a and the support plate 600a may be fixed so as to be in contact with each other, face to face, without any solder pasting or spot welding.

Figure 9B:
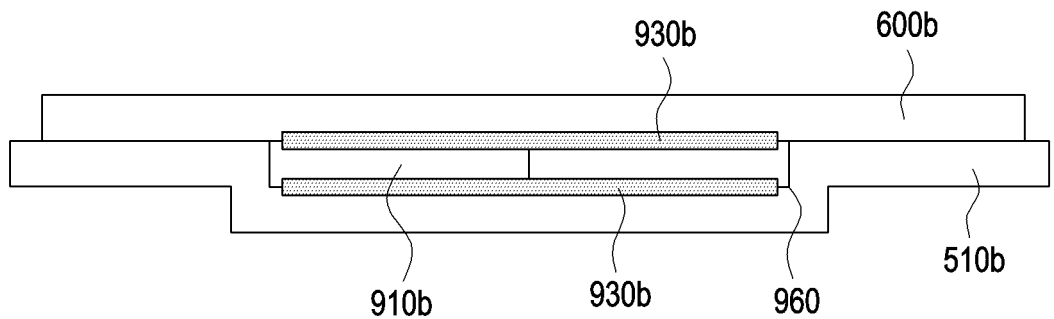

Referring to FIG. 9B, at least one heat pipe 910b may be coupled to the heat dissipation plate 510b by solder pasting 930b. The at least one heat pipe 910b may be coupled to the support plate 600b by solder pasting 930b. In the case in which the heat dissipation plate 510b is to be coupled to the support plate 600b, when the at least one heat pipe 910b and the support plate 600a are coupled by solder pasting or spot welding, the heat dissipation plate 510b and the support plate 600b may be fixed so as to be disposed in face-to-face contact with each other, without using solder pasting or spot welding.

Figure 9C:
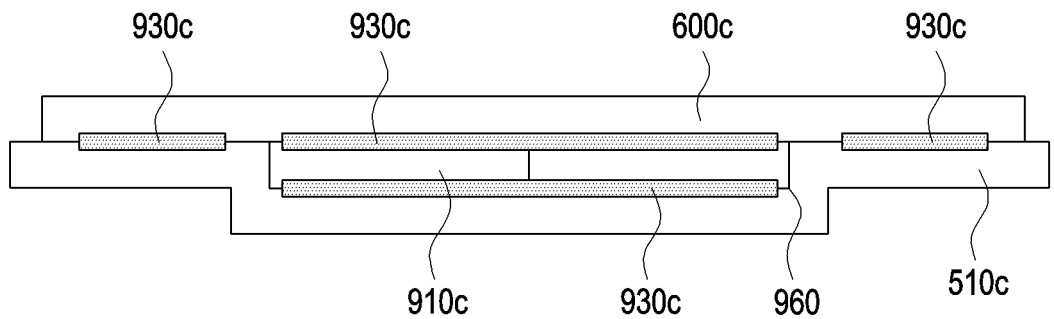

Referring to FIG. 9C, the support plate 600c may be coupled to the heat dissipation plate 510c by solder pasting 930c. At least one heat pipe 910c may be coupled to the heat dissipation plate 510c via the solder pasting 930c. The at least one heat pipe 910c may be coupled to the support plate 600c via the solder pasting 930c.

Figure 9D:
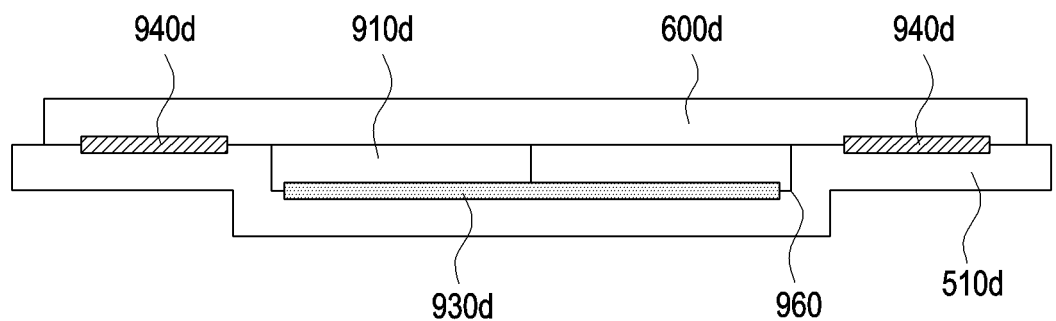

Referring to FIG. 9D, the support plate 600d may be coupled to the heat dissipation plate 510d via spot welding 940d. At least one heat pipe 910d may be coupled to the heat dissipation plate 510d via solder pasting 930d. In the case where the at least one heat pipe 910d is to be coupled to the support plate 600d, when the heat dissipation plate 510a and the support plate 600a are coupled by solder pasting or spot welding, the at least one heat pipe 910d and the support plate 600d may be fixed so as to be disposed in face-to-face contact with each other without using solder pasting or spot welding.

Figure 9E:
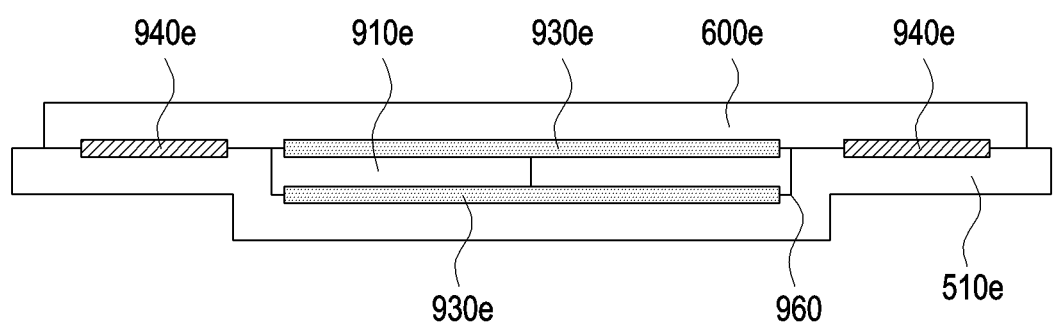

Referring to FIG. 9E, the support plate 600e may be coupled to the heat dissipation plate 510e by spot welding 940e. At least one heat pipe 910e may be coupled to the heat dissipation plate 510e by solder pasting 930e. At least one heat pipe 910c may be coupled to the support plate 600c by the solder pasting 930e.

While five coupling embodiments have been presented in this illustration, the disclosure is not limited thereto, and the support plates 600a to 600e, the heat dissipation plates 510a to 510e, and the heat pipes 910a to 910e may be coupled in various manners by spot welding or solder pasting.

Figure 10:
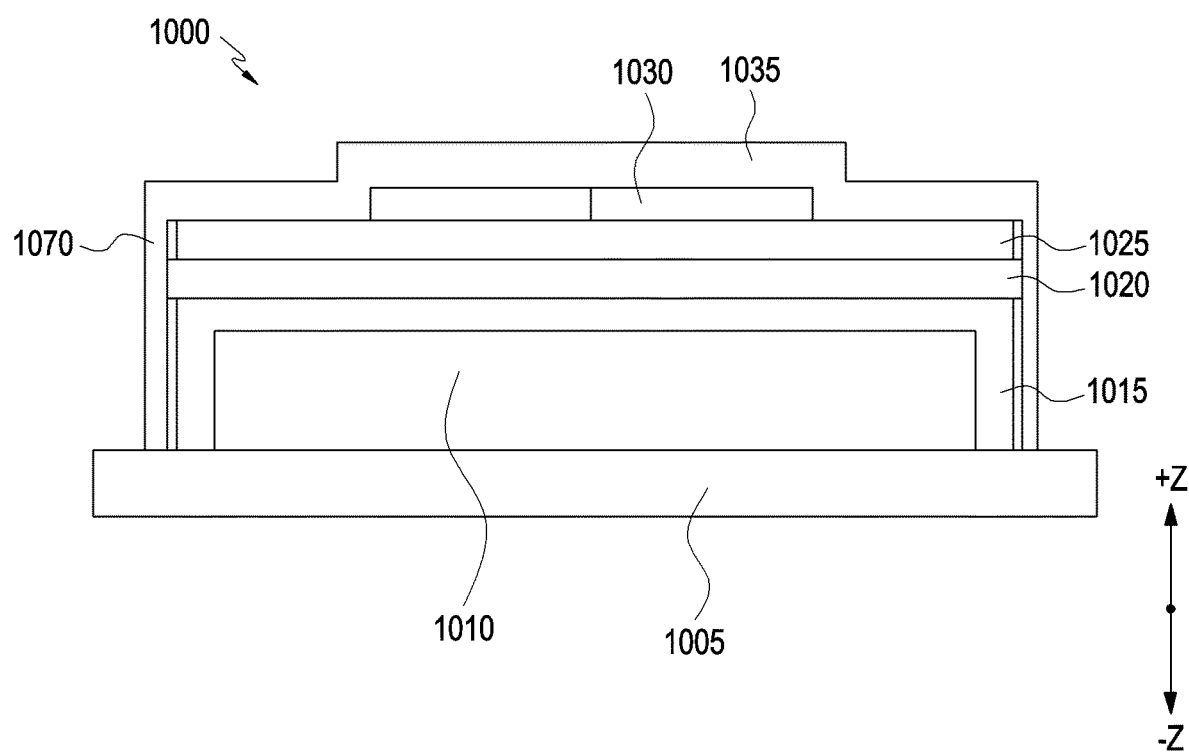
FIG. 10 is a sectional view illustrating a structure for shielding and heat dissipation, to which a heat dissipation module and a support plate are applied according to certain embodiments of the disclosure.

FIG. 10 is a sectional view illustrating a structure for shielding and heat dissipation, to which a heat dissipation module and a support plate are applied according to certain embodiments of the disclosure.

Referring to FIG. 10, an electronic device (e.g., the electronic devices 101 and 400 of FIGS. 1 to 10) may include a heat dissipation plate 1035, a support plate 1025, a heat pipe 1030, a shield can 1015, a circuit board 1005, a shielding structure 1020, a sidewall structure 1070, and an electronic component 1010. The configurations of the heat dissipation plate 1035, the support plate 1025, the heat pipe 1030, the shield can 1015, and the circuit board 1005 of FIG. 10 may be wholly or partially identical to those of the heat dissipation plates 510, and 510a to 510e, the heat pipes 520a, 520b, and 910a to 910e, and the support plates 600 and 600a to 600e illustrated in FIGS. 5A to 9E, the circuit board 800 and the shield can structures 820a and 820b illustrated in FIGS. 8A, 8B and 8C, and the sidewall structure 550 illustrated in FIGS. 5A to 8C.

In FIG. 10, '+Z' or '−Z' may indicate an upward or downward direction, when a structure 1000 to which the heat dissipation module and the support plate are applied is viewed from a side. Further, in an embodiment, '+Z' may represent a frontal direction in which the electronic component 1010 disposed within the electronic device faces the front surface (e.g., the front surface 200a of FIG. 2) of the electronic device, and '−Z' may represent a rear direction in which the electronic component 1010 disposed inside the electronic device faces the rear surface (e.g., the rear surface 200b of FIG. 2) of the electronic device. In another embodiment, '−Z' may represent the frontal direction in which the electronic component 1010 disposed within the electronic device faces the front surface (e.g., the front surface 200a of FIG. 2) of the electronic device, and '+Z' may represent the rear direction in which the electronic component 1010 disposed inside the electronic device faces the rear surface (e.g., the rear surface 200b of FIG. 2) of the electronic device.

According to certain embodiments, a plurality of electronic components may be disposed on at least one surface of the circuit board 1005 (e.g., the circuit board 800 of FIGS. 8A, 8B and 8C). Some electronic component 1010 among the plurality of electronic components may include, for example, at least one chip disposed on at least one surface of the circuit board 1005, and may include at least one of an AP or a CP. The electronic components may generate heat, as described previously.

According to certain embodiments, the shield can 1015 may be formed so as to surround at least a part of the electronic component 1010. The shield can 1015 may be coupled with one surface (e.g., one surface facing the +Z direction) of the circuit board 1005. At least a part of the surface of the circuit board 1005 may be coupled with the shield can 1015 by solder pasting.

According to an embodiment, the shielding structure 1020 may be disposed on one surface of the electronic component 1010, and serve to prevent interference caused by electromagnetic waves generated from the electronic component 1010. This interference may negatively affect other electronic components (not shown) disposed inside the electronic device. According to certain embodiments, the shielding structure 1020 may be the same as the shield can 1015 or may be included in a part of the shield can 1015. For example, when the shielding structure 1020 is the same as the shield can 1015, the shielding structure 1020 may be the top surface of the shield can 1015, without inclusion in the shield can 1015.

According to certain embodiments, the shielding structure 1020 may be disposed on at least a part of the shield can 1015 or included in a part of the shield can 1015. The shielding structure 1020 may provide a shielding function against electromagnetic waves that may be generated from the electronic component 1010 and a heat conduction function for transferring heat that may be generated from the electronic component 1010 to the outside of the electronic component 1010.

According to certain embodiments, the heat dissipation plate 1035 and the heat pipe 1030 may be disposed in the +Z-axis direction of the shield can 1015 surrounding the electronic component 1010, or the shielding structure 1020, and serve to diffuse heat generated from the electronic component 1010 to the external environment of the electronic device. In addition, the sidewall structure 1070 included in the heat dissipation plate 1035 may be disposed so as to surround at least a part of the electronic component 1010, the shield can 1015, and/or the shielding structure 1020, and supplement the shielding function against electromagnetic waves generated from the electronic component 1010. According to an embodiment, the sidewall structure 1070 may be coupled to a clip structure (not shown here) (e.g., the clip structures of FIGS. 8A and 8B) disposed on at least one surface of the circuit board 1005.

The support plate 1025 according to certain embodiments of the disclosure may be provided between the heat dissipation plate 1035 and the heat pipe 1030, and the electronic component 1010, the shielding structure 1020, and/or the shield can 1015, and thus the heat dissipation plate 1025 and the heat pipe 1030 may be fixedly disposed so as to be in close contact with the electronic component 1010. Due to the resulting rapid diffusion of heat generated from the electronic component 1010 to the external environment of the electronic device, the temperature local to the electronic component 1010 may be effectively lowered.

According to certain embodiments of the disclosure, an electronic device (e.g., the electronic device 101 of FIGS. 1 to 3B and the electronic device 400 of FIG. 4) may include: a first housing (e.g., the housing 200 of FIGS. 2, 3A and 3B and the housing 410 of FIG. 4); a display (e.g., the display 201 of FIGS. 2, 3A and 3B and the display 420 of FIG. 4) disposed inside the first housing; a printed circuit board (e.g., the circuit board 800 of FIGS. 8A, 8B and 8C) disposed inside the first housing; a heat dissipation plate (e.g., the heat dissipation plates 510, 510*a* to 510*e*, and 1035 of FIGS. 5 to 10) disposed to face the printed circuit board; at least one heat pipe (e.g., the heat pipes 520*a*, 520*b*, 910*a* to 910*e*, and 1030 of FIGS. 5 to 10) disposed between the heat dissipation plate and the printed circuit board; and a support plate (e.g., the support plates 600, 600*a* to 600*e*, and 1025 of FIGS. 6A to 10) disposed between the printed circuit board and the heat dissipation plate. The support plate may include a first portion (e.g., the first portion 610 of FIGS. 6A to 8C) disposed in contact with at least a part of the at least one heat pipe, and a second portion (e.g., the second portions 620*a* and 620*b* of FIGS. 6A to 8C) extending from the first portion in a second direction perpendicular to a first direction in which the at least one heat pipe is disposed, and coupled to at least a part of the heat dissipation plate. According to certain embodiments, the support plate may include a third portion (e.g., the wall structure 630 of FIGS. 6A to 8C) extending from the first portion in a third direction perpendicular to the first direction and the second direction, and coupled with the printed circuit board.

According to certain embodiments, the printed circuit board may include at least one first component, and further include a shield can (e.g., the shield can structures 820*a* and 820*b* of FIGS. 8A, 8B and 8C, and the shield can 1015 of FIG. 10) configured to cover the at least one first component, and the support plate may be disposed in contact with the shield can.

According to certain embodiments, the support plate may be disposed between the shield can (e.g., the shield can structures 820*a* and 820*b* of FIGS. 8A, 8B and 8C, and the shield can 1015 of FIG. 10) and the heat dissipation plate.

According to certain embodiments, the support plate may be formed of a material having a greater rigidity than the heat dissipation plate and the heat pipe.

According to certain embodiments, the support plate may be coupled to the heat pipe by solder pasting (e.g., the solder pasting 930*a* to 930*e* of FIGS. 9A to 9E).

According to certain embodiments, the support plate may be coupled to the heat dissipation plate by at least one of solder pasting (e.g., the solder pasting 930*a* to 930*e* of FIGS. 9A to 9E) or spot welding (e.g., the spot welding 940*d* and 940*e* of FIGS. 9A to 9E).

According to certain embodiments, the heat dissipation plate may be coupled to the heat pipe by solder pasting (e.g., the solder pasting 930*a* to 930*e* of FIGS. 9A to 9E).

According to certain embodiments, the printed circuit board may include at least one clip structure (e.g., the clip structures 810*a* to 810*d* of FIGS. 8A, 8B and 8C), and the third portion may be coupled with the at least one clip structure.

According to certain embodiments, the printed circuit board may be coupled to the third portion by at least one of solder pasting (e.g., the solder pasting 930*a* to 930*e* of FIGS. 9A to 9E) or spot welding (e.g., the spot welding 940*d* and 940*e* of FIGS. 9A to 9E).

According to certain embodiments, the support plate may be formed of at least one of copper (Cu), stainless steel, or aluminum (Al).

According to certain embodiments, a maximum face-to-face distance between the heat dissipation plate and the printed circuit board may be 3 to 6 mm or less.

According to certain embodiments of the disclosure, a support plate (e.g., the support plates 600, 600*a* to 600*e*, and 1025 of FIGS. 6A to 10) may include a first portion (e.g., the first portion 610 of FIGS. 6A to 8C) disposed in contact with at least a part of at least one heat pipe (e.g., the heat pipes 520*a*, 520*b*, 910*a* to 910*e*, and 1030 of FIGS. 5 to 10), and a second portion (e.g., the second portions 620*a* and 620*b* of FIGS. 6A to 8C) extending from the first portion in a second direction perpendicular to a first direction in which the at least one heat pipe is disposed, and coupled to at least a part of a heat dissipation plate (e.g., the heat dissipation plates 510, 510*a* to 510*e*, and 1035 of FIGS. 5 to 10).

According to certain embodiments, the support plate may include a third portion extending from the first portion in a third direction perpendicular to the first direction and the second direction, and coupled with a printed circuit board (e.g., the circuit board 800 of FIGS. 8A, 8B and 8C).

According to certain embodiments, the printed circuit board may include at least one first component, and further include a shield can (e.g., the shield can structures 820*a* and 820*b* of FIGS. 8A, 8B and 8C, and the shield can 1015 of FIG. 10) configured to cover the at least one first component, and the support plate may be disposed in contact with the shield can.

According to certain embodiments, the support plate may be disposed between the shield can (e.g., the shield can structures 820*a* and 820*b* of FIGS. 8A, 8B and 8C, and the shield can 1015 of FIG. 10) and the heat dissipation plate.

According to certain embodiments, the support plate may be formed of a material having a greater rigidity than the heat dissipation plate and the heat pipe.

According to certain embodiments, the support plate may be coupled to the heat pipe by solder pasting (e.g., the solder pasting 930*a* to 930*e* of FIGS. 9A to 9E).

According to certain embodiments, the support plate may be coupled to the heat dissipation plate by at least one of solder pasting (e.g., the solder pasting 930*a* to 930*e* of FIGS. 9A to 9E) or spot welding (e.g., the spot welding 940*d* and 940*e* of FIGS. 9A to 9E).

According to certain embodiments, the printed circuit board may include at least one clip structure (e.g., the clip structures 810*a* to 810*d* of FIGS. 8A, 8B and 8C), and the third portion may be coupled with the at least one clip structure.

According to certain embodiments, the printed circuit board may be coupled to the third portion by at least one of solder pasting or spot welding.

According to certain embodiments, the support plate may be formed of at least one of copper (Cu), stainless steel, or aluminum (Al).

It will be apparent to those skilled in the art that the above-described electronic device including a support plate according to the disclosure is not limited to the foregoing embodiments and drawings, and many replacements, modifications, and variations can be made within the technical scope of the disclosure.

What is claimed is:

1. An electronic device, comprising:
    a housing;
    a display disposed within the housing;
    a printed circuit board disposed within the housing;
    a heat dissipation plate disposed to face the printed circuit board;
    at least one heat pipe disposed between the heat dissipation plate and the printed circuit board; and
    a support plate disposed between the printed circuit board and the heat dissipation plate,
    wherein the support plate includes:
    a first portion disposed so as to contact with at least a part of the at least one heat pipe; and
    a second portion extending from the first portion in a second direction perpendicular to a first direction in which the at least one heat pipe is disposed, the second portion coupled to at least a part of the heat dissipation plate, and
    wherein the printed circuit board and the heat dissipation plate overlap each other when view from a direction in which the display faces the printed circuit board.

2. The electronic device of claim 1, wherein the support plate further includes a third portion extending from the first portion in a third direction perpendicular to the first direction and the second direction, the third portion coupled with the printed circuit board.

3. The electronic device of claim 2, wherein the printed circuit board includes at least one clip structure, and
    wherein the third portion is coupled with the at least one clip structure.

4. The electronic device of claim 2, wherein the printed circuit board is coupled to the third portion by at least one of solder pasting or spot welding.

5. The electronic device of claim 1, wherein the printed circuit board includes at least one first component,
    wherein the printed circuit board further includes a shield can disposed so as to cover the at least one first component,
    wherein the support plate contacts with the shield can, and
    wherein the support plate is disposed between the shield can and the heat dissipation plate.

6. The electronic device of claim 1, wherein the support plate is formed of a material having a greater rigidity than both the heat dissipation plate and the heat pipe.

7. The electronic device of claim 1, wherein the support plate is coupled to the heat pipe via solder pasting.

8. The electronic device of claim 1, wherein the support plate is coupled to the heat dissipation plate via at least one of solder pasting or spot welding.

9. The electronic device of claim 1, wherein the heat dissipation plate is coupled to the heat pipe via solder pasting.

10. The electronic device of claim 1, wherein the support plate is formed of at least one of copper (Cu), stainless steel, or aluminum (Al).

11. The electronic device of claim 1, wherein a maximum face-to-face distance between the heat dissipation plate and the printed circuit board is 3 mm to 6 mm or less.

12. A support plate, comprising:
    a first portion disposed in contact with at least a part of at least one heat pipe; and
    a second portion extending from the first portion in a second direction perpendicular to a first direction along which the at least one heat pipe is disposed, the second portion coupled to at least a part of a heat dissipation plate,
    wherein the first portion and the second portion are contiguous with each other and disposed on a common plane.

13. The support plate of claim 12, further comprising a third portion extending from the first portion in a third direction perpendicular to both the first direction and the second direction, the third portion coupled with a printed circuit board.

14. The support plate of claim 13, wherein the printed circuit board includes at least one clip structure, and
    wherein the third portion is coupled with the at least one clip structure.

15. The support plate of claim 13, wherein the printed circuit board is coupled to the third portion via at least one of solder pasting or spot welding.

16. The support plate of claim 12, wherein the printed circuit board includes at least one first component,
    wherein the printed circuit board further includes a shield can disposed so as to cover the at least one first component,
    wherein the support plate is disposed in contact with the shield can, and
    wherein the support plate is disposed between the shield can and the heat dissipation plate.

17. The support plate of claim 12, wherein the support plate is formed of a material having a greater rigidity than the heat dissipation plate and the heat pipe.

18. The support plate of claim 12, wherein the support plate is coupled to the heat pipe via solder pasting.

19. The support plate of claim 12, wherein the support plate is coupled to the heat dissipation plate via at least one of solder pasting or spot welding.

20. An electronic device, comprising:
    a housing;
    a display disposed within the housing;
    a printed circuit board disposed within the housing;
    a heat dissipation plate disposed to face the printed circuit board;
    at least one heat pipe disposed between the heat dissipation plate and the printed circuit board; and
    a support plate disposed between the printed circuit board and the heat dissipation plate,
    wherein the support plate includes:
    a first portion disposed so as to contact with at least a part of the at least one heat pipe, and disposed to cross the at least one heat pipe in a first direction; and
    a second portion extending from the first portion in a second direction different from the first direction, the second portion coupled to at least a part of the heat dissipation plate,
    wherein the first portion is integrally formed with the second portion.

* * * * *